United States Patent
Tsai et al.

Patent Number: 5,858,846
Date of Patent: Jan. 12, 1999

[54] SALICIDE INTEGRATION METHOD

[75] Inventors: Chao-Chieh Tsai, Taichung; Wen-Chen Lin, Chiung-Lin; Liang Szuma, Taipei, all of Taiwan

[73] Assignee: Taiwan Semiconductor Manufacturing Company, Ltd., Hsin-Chu, Taiwan

[21] Appl. No.: 905,338

[22] Filed: Aug. 4, 1997

[51] Int. Cl.[6] ............................................. H01L 21/336
[52] U.S. Cl. .......................... 438/303; 438/533; 438/586; 438/649; 438/655
[58] Field of Search .................................. 438/301, 303, 438/305, 533, 586, 649, 655, 664, 682, 683

[56] References Cited

U.S. PATENT DOCUMENTS

| | | | |
|---|---|---|---|
| 4,835,112 | 5/1989 | Pfiester et al. | 437/24 |
| 5,330,921 | 7/1994 | Yoshida et al. | 437/25 |
| 5,384,268 | 1/1995 | Lur et al. | 437/20 |
| 5,444,024 | 8/1995 | Anjum et al. | 437/200 |
| 5,460,998 | 10/1995 | Liu | 437/57 |
| 5,508,212 | 4/1996 | Wang et al. | 437/24 |

FOREIGN PATENT DOCUMENTS 63-307726  12/1988  Japan .

OTHER PUBLICATIONS

Wolf, S., et al., Silicon Processing for the VLSI Era, vol. 1, 1986, Lattice Press, pp. 280–292, 390–399.
Sze, S., VLSI Technology, Second Edition, McGraw–Hill, 1988, . pp. 485–486.

*Primary Examiner*—T. N. Quach
*Attorney, Agent, or Firm*—George O. Saile; Stephen B. Ackerman; Rosemary L. S. Pike

[57] ABSTRACT

A method for preventing gate to source/drain bridging and reducing junction leakage by preventing defects in the source/drain region in the fabrication of a silicided polysilicon gate is described. A polysilicon gate electrode on a semiconductor substrate and associated source and drain regions within the semiconductor substrate are provided wherein spacers are formed on the sidewalls of the gate electrode. A layer of titanium is deposited over the gate electrode, spacers and source and drain regions within the semiconductor substrate. Arsenic ions are implanted into the titanium layer. The semiconductor substrate is annealed for a first time whereby the titanium layer is transformed into a titanium silicide layer except where the titanium layer overlies the spacers. The titanium layer overlying the spacers is stripped to leave the titanium silicide layer only on the top surface of the gate electrode and on the top surface of the semiconductor substrate overlying the source and drain regions. The semiconductor substrate is annealed for a second time whereby the titanium silicide is transformed into a lower resistance phase. An insulating layer is deposited over the surface of the semiconductor substrate covering the gate electrode. Metallization with electrical connections is provided to complete the fabrication of the integrated circuit device.

22 Claims, 4 Drawing Sheets

SALICIDE INTEGRATION METHOD

BACKGROUND OF THE INVENTION (1) Field of the Invention

The invention relates to the fabrication of integrated circuit devices, and more particularly, to a method of preventing source/drain defects and preventing gate to source/drain bridging during salicidation in the fabrication of integrated circuits.

(2) Description of the Prior Art

In the fabrication of integrated circuits, a silicide is often formed overlying a structure to be contacted by a higher level conducting layer. A silicide is often formed on top of a polysilicon gate and overlying the source and drain regions within a substrate. Typically, a titanium layer is deposited over the wafer. The wafer is subjected to a thermal process which causes the underlying silicon to react with the titanium layer to form titanium silicide. FIG. 1 illustrates a partially completed integrated circuit device of the prior art. A gate electrode 16 has been formed on the surface of a semiconductor substrate 10. Source and drain regions 20 have been formed within the substrate. Sidewall spacers 18 are typically composed of silicon dioxide or silicon nitride. A layer of titanium 24 is deposited over the surface of the wafer. A rapid thermal process causes the silicon atoms within the polysilicon gate and the substrate to diffuse into the titanium layer and react with the titanium to form titanium silicide 26, as illustrated in FIG. 2. The titanium layer 24 over the sidewall spacers 18 and the field oxide regions 12 is not reacted and can be removed easily. However, silicon from the gate and from the substrate can diffuse into the titanium layer overlying the sidewall spacers causing titanium silicide to form overlying the spacers as well. This is the so-called bridging problem. The titanium silicide layer over the spacers shorts the source/drain to the gate leading to malfunction of the device.

Also, if the titanium silicide 26 grows too thick, the interface between the titanium silicide 26 and the silicon 10 will be very rough, causing spiking through the source/drain junction, as indicated by 27. This will cause junction leakage. Furthermore, the thicker the titanium silicide, the higher the stress underlying the titanium silicide layer. This high stress results in silicon lattice defects 29 near the junction, leading to junction leakage also.

In an attempt to solve the bridging problem, Arsenic has been implanted into the substrate before the titanium layer is deposited to suppress bridging. However, the large mass of the Arsenic implant will damage the silicon and cause it to become amorphous. U.S. Pat. No. 5,508,212 to Wang et al teaches large angle implantation of nitrogen into the titanium layer to form titanium nitride in the upper portion of the titanium layer over the gate and the source/drain regions and within the whole of the titanium layer over the sidewall spacers thus preventing formation of titanium silicide over the spacers. U.S. Pat. No. 5,330,921 to Yoshida et al teaches depositing a titanium film, then an amorphous silicon film over a planned source/drain region. A rapid thermal process with nitrogen forms titanium silicide under the amorphous silicon layer. The source/drain regions are formed by implanting through the titanium silicide and amorphous silicon films wherein the implantation is within a specific dosage range dependent on the titanium silicide thickness in order to form shallow junctions. U.S. Pat. No. 5,835,112 to Pfiester et al also form shallow junctions by implanting germanium before the titanium deposition and salicidation. Ions are implanted through the titanium silicide to form source/drain regions wherein the germanium reduces the diffusion allowing for shallow junctions. U.S. Pat. No. 5,444,024 to Anjum et al teaches deposition of Argon ions after titanium deposition so as to reduce silicide growth over the source/drain regions. This allows the thickness of the titanium silicide layer to be controlled in order to reduce defects.

SUMMARY OF THE INVENTION

A principal object of the present invention is to provide an effective and very manufacturable method of fabricating a silicided polysilicon gate in the fabrication of an integrated circuit.

A further object of the invention is to provide a method of preventing gate to source/drain bridging in the fabrication of a silicided polysilicon gate.

A still further object is to provide a method of preventing defects in the source/drain region in the fabrication of a silicided polysilicon gate.

Yet another object is to provide a method of reducing junction leakage by preventing defects in the source/drain region in the fabrication of a silicided polysilicon gate.

Yet another object of the invention is to provide a method of preventing gate to source/drain bridging and reducing junction leakage by preventing defects in the source/drain region in the fabrication of a silicided polysilicon gate.

In accordance with the objects of this invention a method for preventing gate to source/drain bridging and reducing junction leakage by preventing defects in the source/drain region in the fabrication of a silicided polysilicon gate is achieved. A polysilicon gate electrode on a semiconductor substrate and associated source and drain regions within the semiconductor substrate are provided wherein spacers are formed on the sidewalls of the gate electrode. A layer of titanium is deposited over the gate electrode, spacers and source and drain regions within the semiconductor substrate. Arsenic ions are implanted into the titanium layer. The semiconductor substrate is annealed for a first time whereby the titanium layer is transformed into a titanium silicide layer except where the titanium layer overlies the spacers. The titanium layer overlying the spacers is stripped to leave the titanium silicide layer only on the top surface of the gate electrode and on the top surface of the semiconductor substrate overlying the source and drain regions. The semiconductor substrate is annealed for a second time whereby the titanium silicide is transformed into a lower resistance phase. An insulating layer is deposited over the surface of the semiconductor substrate covering the gate electrode. Metallization with electrical connections is provided to complete the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
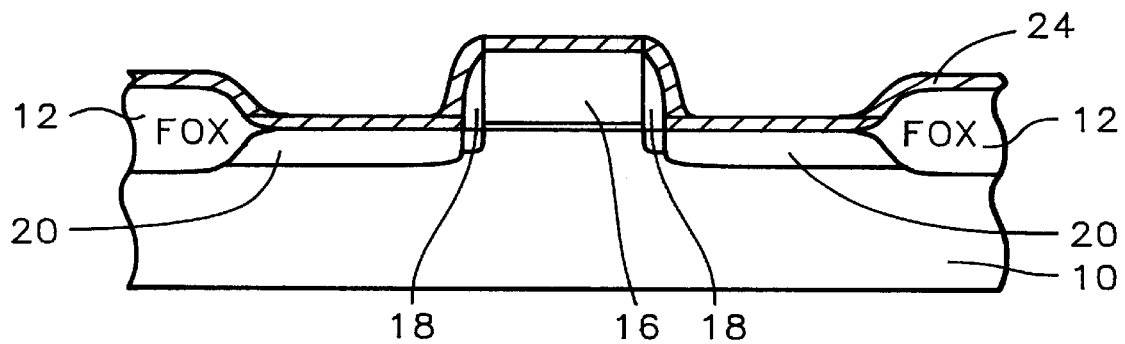
FIGS. 1 and 2 schematically illustrate in cross-sectional representation an embodiment of the prior art.
Figure 2:
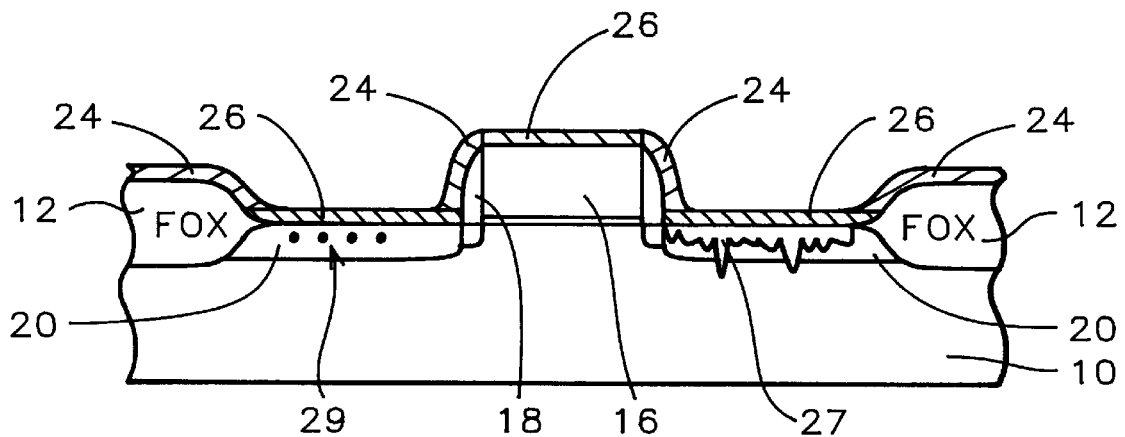
Figure 3:
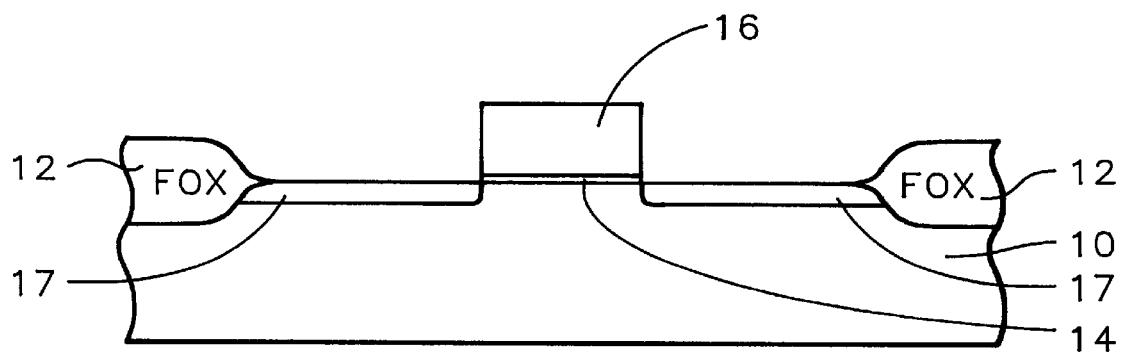
FIGS. 3 through 8 schematically illustrate in cross-sectional representation a preferred embodiment of the present invention.

Referring now more particularly to FIG. 3, there is shown an illustration of a portion of a partially completed integrated circuit. The semiconductor substrate 10 is preferably composed of silicon having a (100) crystallographic orientation. Field Oxide regions 12 are formed as are conventional in the art. The surface of the silicon substrate 10 is thermally oxidized to form the gate oxide layer 14.

Next, a layer of polysilicon 16 is deposited, for example, by low pressure chemical vapor deposition (LPCVD) to a suitable thickness of between about 2000 and 3000 Angstroms.

The polysilicon and gate oxide layers are etched away where they are not covered by a mask to provide a polysilicon gate electrode, as illustrated in FIG. 3.

Lightly doped source and drain regions 17 are formed by ion implantation, as is conventional in the art.

Figure 4:
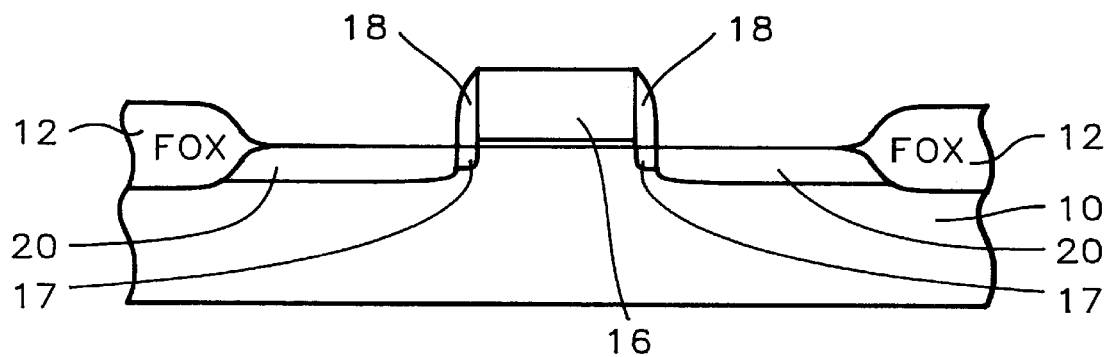

Referring now to FIG. 4, a dielectric layer is deposited over the gate electrode and the surface of the substrate to a thickness of between about 1000 and 1500 Angstroms. The dielectric layer may be composed of silicon dioxide, silicon nitride, or the like.

The dielectric layer is anisotropically etched to leave spacers 18 on the sidewalls of the gate electrode. The spacers may be between about 800 and 1500 Angstroms wide.

Heavily doped source and drain regions 20 are formed within the semiconductor substrate, typically by $BF_2$ ion implant.

Figure 5:
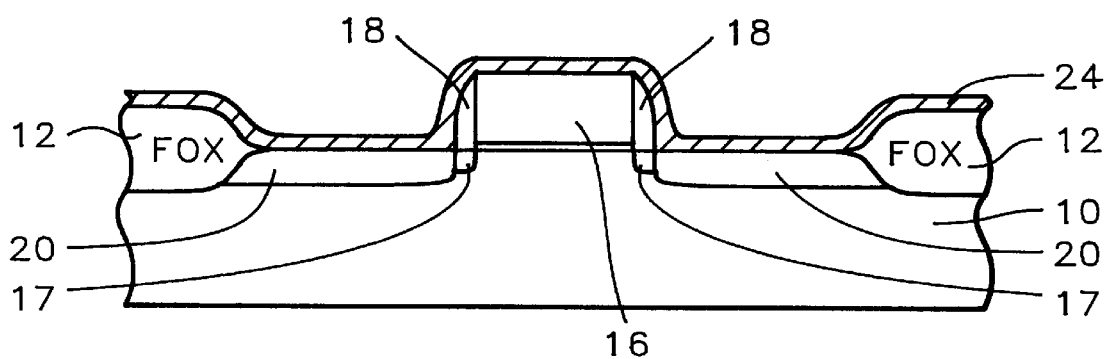

Now the silicided polysilicon gate of the present invention will be formed. A layer of titanium 24 is deposited conformally over the semiconductor substrate, as shown in FIG. 5, to a thickness of between about 250 and 400 Angstroms. Alternatively, copper could be used in place of titanium with similar results.

Figure 6:
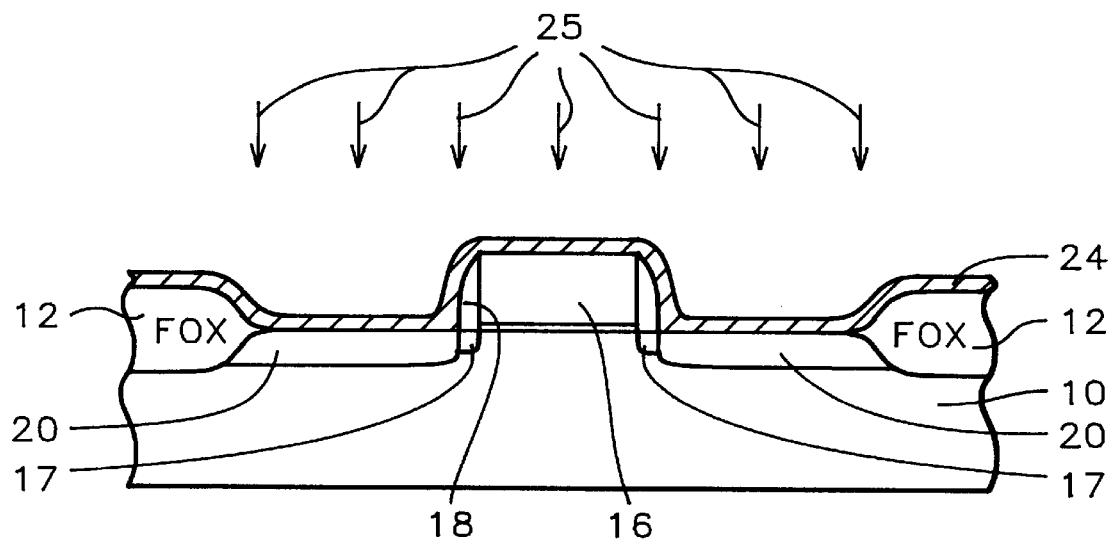
Figure 7:
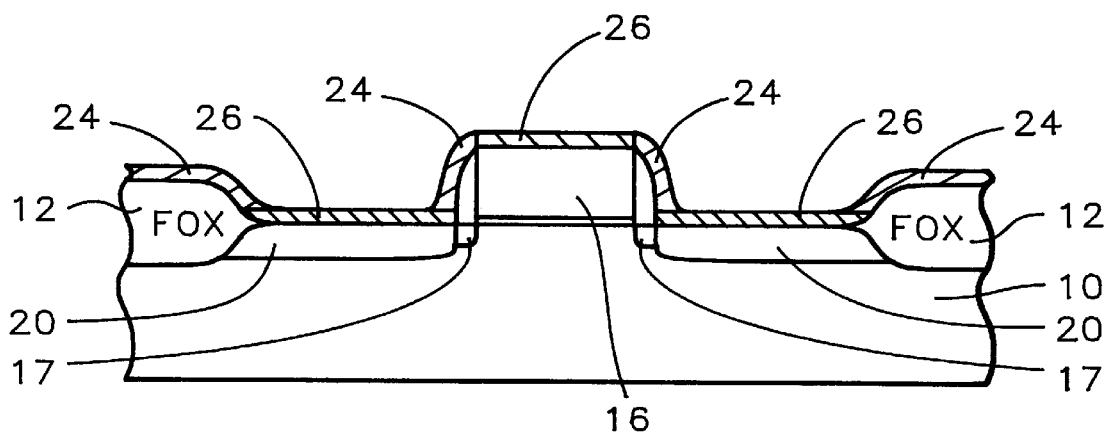

Referring now to FIG. 6, Arsenic ions 25 are blanket implanted into the titanium layer with a dosage of between about $4 \times 10^{14}$ $8 \times 10^{14}$ atoms/cm$^2$, energy of 20 to 40 KeV and a tilt angle of about 7°. The Arsenic ions stuff the grain boundaries of the titanium layer.

The titanium layer 24 is transformed into titanium silicide 26 by a thermal annealing cycle. This is preferably a rapid thermal anneal (RTA) at a temperature of between about 725° to 740° C. for between about 20 to 30 seconds in a nitrogen ambient. The titanium in contact with the silicon substrate or with the polysilicon will form titanium silicide, $TiSi_x$ 26. During the thermal reaction, the previously implanted Arsenic ions stuff the grain boundaries of the newly formed titanium silicide, increasing the difficulty of a distant diffusion. Therefore, the silicon cannot diffuse into the titanium over the spacers. Also during the RTA, titanium nitride, not shown, will form over both the unreacted titanium and the titanium silicide. This can be removed when the unreacted titanium is removed.

Figure 8:
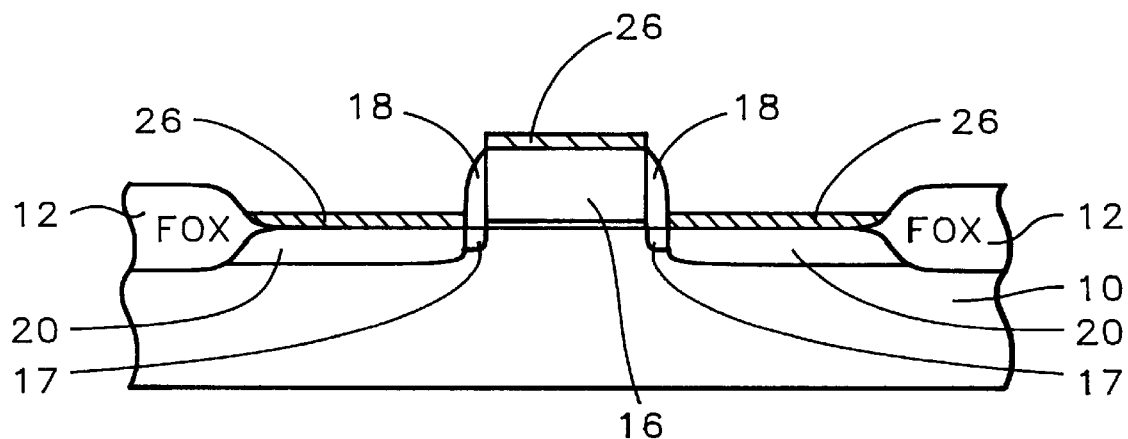

The remaining unreacted titanium 24 can be etched away using, for example, $NH_4OH/H_2O_2$ with deionized water. The resulting structure is illustrated in FIG. 8.

After the unreacted titanium is stripped, a second RTA is performed to transform the titanium silicide to the C54 phase which has a much lower resistance. This RTA may be at a temperature of between about 840° and 900° C. for 10 to 30 seconds.

Arsenic ions can impinge on the lattice atoms of the silicon causing lattice defects. However, in the process of the present invention, the Arsenic is implanted into the titanium layer rather than into the silicon before the deposition of the titanium. The majority of the Arsenic ions will remain within the titanium layer and not enter the silicon.

Figure 9:
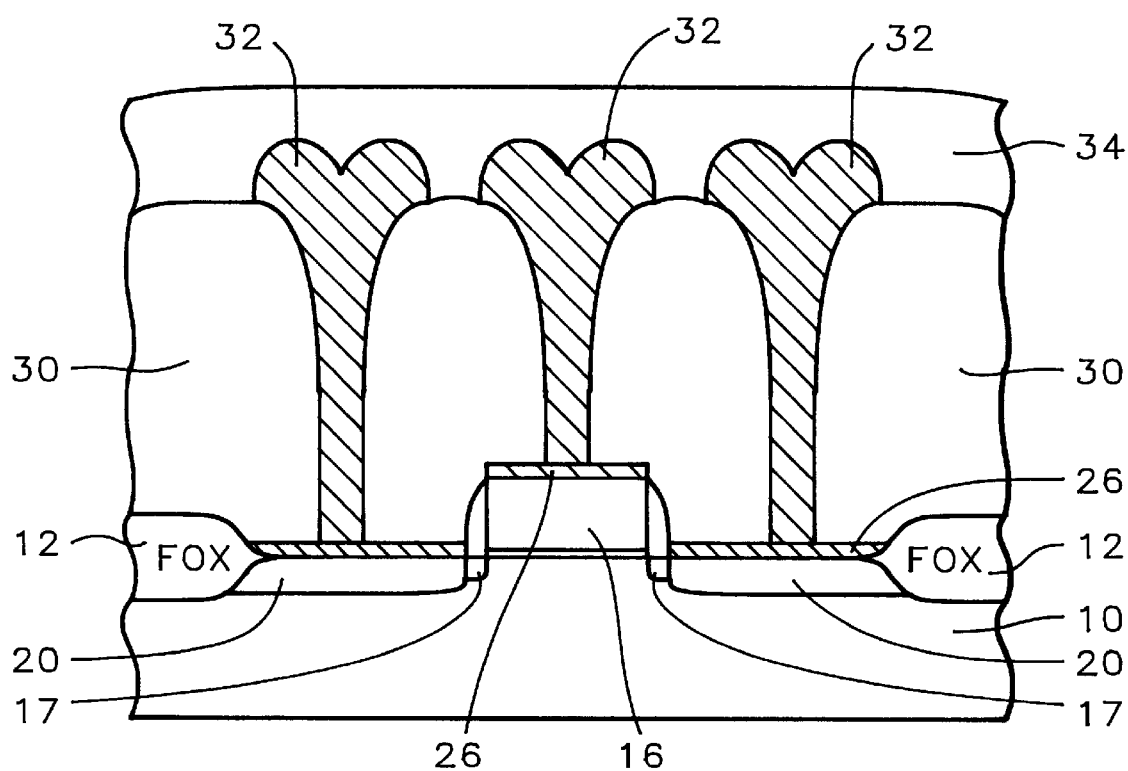
FIG. 9 schematically illustrates in cross-sectional representation a completed integrated circuit device fabricated by the process of the present invention.

The integrated circuit device is completed as is conventional in the art. For example, as illustrated in FIG. 9, an insulating layer, such as silicon oxide or borophospho-TEOS (BPTEOS) 30 is blanket deposited over the semiconductor substrate to a thickness of between about 4000 to 12,000 Angstroms and then planarized, for example, by chemical mechanical polishing (CMP). Openings are etched through the insulating layer and the titanium silicide layer to underlying source and drain regions and other areas where electrical contact is to be made. A conducting layer 32 is deposited and patterned to complete the electrical connections. A passivation layer 34 completes the fabrication of the integrated circuit device.

The process of the invention provides an effective method of fabricating an integrated circuit device having a silicided polysilicon gate with reduced leakage current and no bridging of the silicide layer. The Arsenic ions within the titanium layer overlying the sidewall spacers prevent the silicon from the gate and from the substrate from diffusing into the titanium layer overlying the sidewall spacers. Also, the implantation of the Arsenic ions after the titanium layer has been deposited prevents lattice defects and stress-induced junction spiking and therefore, prevents junction leakage.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a polysilicon gate electrode on a semiconductor substrate and associated source and drain regions within said semiconductor substrate wherein spacers are formed on the sidewalls of said gate electrode;

conformally depositing a layer of titanium over said gate electrode, said spacers and said source and drain regions within said semiconductor substrate;

implanting arsenic ions into said titanium layer;

first annealing said semiconductor substrate whereby said titanium layer is transformed into a titanium silicide layer except where said titanium layer overlies said spacers and whereby said arsenic ions stuff the grain boundaries of said titanium silicide layer thereby preventing diffusion of silicon from said titanium silicide layer into said titanium layer overlying said spacers;

stripping said titanium layer overlying said spacers to leave said titanium silicide layer only on the top surface of said gate electrode and on the top surface of said semiconductor substrate overlying said source and drain regions;

second annealing said semiconductor substrate whereby the resistance of said titanium silicide layer is decreased;

depositing an insulating layer over the surface of said semiconductor substrate covering said gate electrode; and providing metallization with electrical connections to complete the fabrication of said integrated circuit device.

2. The method according to claim 1 wherein said spacers comprise silicon nitride and have a width of between about 800 and 1500 Angstroms.

3. The method according to claim 1 wherein said spacers comprise silicon oxide and have a width of between about 800 and 1500 Angstroms.

4. The method according to claim 1 wherein said titanium layer is deposited to a thickness of between about 250 and 400 Angstroms.

5. The method according to claim 1 wherein said arsenic ions are implanted at a dosage of between about $4\times10^{14}$ and $8\times10^{14}$ atoms/cm$^2$ and an energy of between about 20 and 40 KeV.

6. The method according to claim 1 wherein said first annealing is a rapid thermal anneal (RTA) performed in a nitrogen ambient at a temperature of between about 725° and 740° C. for between about 20 to 30 seconds.

7. The method according to claim 1 wherein said stripping of said titanium layer overlying said spacers is done using $NH_4OH/H_2O_2/H_2O$.

8. The method according to claim 1 wherein said second annealing is a rapid thermal anneal (RTA) performed in a nitrogen ambient at a temperature of between about 840° to 900° C. for between about 10 to 30 seconds.

9. A method of fabricating an integrated circuit device comprising:

growing a layer of gate silicon oxide over the surface of a semiconductor substrate;

depositing a polysilicon layer overlying said gate silicon oxide layer;

etching away said polysilicon and said gate oxide layers where they are not covered by a mask to form a gate electrode;

implanting first BF$_2$ ions to form lightly doped regions within said semiconductor substrate using said gate electrode as a mask;

depositing a dielectric layer overlying said semiconductor substrate and said gate electrode; anisotropically etching said dielectric layer to leave spacers on the sidewalls of said gate electrode;

implanting second BF$_2$ ions to form P+ source and drain regions within said semiconductor substrate using said gate electrode and said spacers as a mask;

conformally depositing a layer of titanium over the surfaces of said semiconductor substrate;

implanting arsenic ions into said titanium layer;

first annealing said semiconductor substrate whereby said titanium layer is transformed into a titanium silicide layer except where said titanium layer overlies said spacers and whereby said arsenic ions stuff the grain boundaries of said titanium silicide layer thereby preventing diffusion of silicon from said titanium silicide layer into said titanium layer overlying said spacers;

stripping said titanium layer overlying said spacers to leave said titanium silicide layer only on the top surface of said gate electrode and on the top surface of said semiconductor substrate overlying said source and drain regions;

second annealing said semiconductor substrate whereby said titanium silicide layer has lower resistance;

depositing an insulating layer over the surface of said semiconductor substrate covering said gate electrode; and providing metallization with electrical connections to complete the fabrication of said integrated circuit device.

10. The method according to claim 9 wherein said polysilicon layer is deposited by low pressure chemical vapor deposition to a thickness of between about 2000 and 3000 Angstroms.

11. The method according to claim 9 wherein said dielectric layer is deposited to a thickness of between about 1000 and 1500 Angstroms.

12. The method according to claim 9 wherein said dielectric layer comprises silicon nitride.

13. The method according to claim 9 wherein said dielectric layer comprises silicon oxide.

14. The method according to claim 9 wherein said spacers have a width of between about 800 and 1500 Angstroms.

15. The method according to claim 9 wherein said titanium layer is deposited to a thickness of between about 250 and 400 Angstroms.

16. The method according to claim 9 wherein said arsenic ions are implanted at a dosage of between about $4\times10^{14}$ and $8\times10^{14}$ atoms/cm$^2$ and an energy of between about 20 and 40 KeV.

17. The method according to claim 9 wherein said first annealing is a rapid thermal anneal (RTA) performed in a nitrogen ambient at a temperature of between about 725° and 740° C. for between about 20 to 30 seconds.

18. The method according to claim 9 wherein said second annealing is a rapid thermal anneal (RTA) performed in a nitrogen ambient at a temperature of between about 840° to 900° C. for between about 10 to 30 seconds.

19. A method of fabricating an integrated circuit device comprising:

providing a polysilicon gate electrode on a semiconductor substrate and associated source and drain regions within said semiconductor substrate wherein spacers are formed on the sidewalls of said gate electrode;

conformally depositing a layer of titanium over said gate electrode, said spacers and said source and drain regions within said semiconductor substrate;

implanting arsenic ions into said titanium layer;

first annealing said semiconductor substrate whereby said titanium layer overlying said gate electrode and said semiconductor substrate is transformed into a titanium silicide layer and wherein said arsenic ions within said titanium layer stuff the grain boundaries of said titanium layer whereby titanium silicon does not form overlying said spacers and whereby said arsenic ions stuff the grain boundaries of said titanium silicide layer thereby preventing diffusion of silicon from said titanium silicide layer into said titanium layer overlying said spacers;

stripping said titanium layer overlying said spacers;

second annealing said semiconductor substrate whereby the resistance of said titanium silicide layer is decreased;

depositing an insulating layer over the surface of said semiconductor substrate covering said gate electrode; and providing metallization with electrical connections to complete the fabrication of said integrated circuit device.

20. The method according to claim 19 wherein said spacers comprise one of the group containing silicon oxide and silicon nitride and wherein said spacers have a width of between about 800 and 1500 Angstroms.

21. The method according to claim 19 wherein said titanium layer is deposited to a thickness of between about 250 and 400 Angstroms.

22. The method according to claim 19 wherein said arsenic ions are implanted at a dosage of between about $4\times10^{14}$ and $8\times10^{14}$ atoms/cm$^2$ and an energy of between about 20 and 40 KeV.

* * * * *